US007099482B1

(12) United States Patent
Jot et al.

(10) Patent No.: US 7,099,482 B1

(45) Date of Patent: Aug. 29, 2006

(54) METHOD AND APPARATUS FOR THE SIMULATION OF COMPLEX AUDIO ENVIRONMENTS

(75) Inventors: Jean-Marc Jot, Aptos, CA (US); Samuel C. Dicker, Santa Cruz, CA (US)

(73) Assignee: Creative Technology Ltd, Singapore (SG)

( * ) Notice: Subject to any disclaimer, the term of this patent is extended or adjusted under 35 U.S.C. 154(b) by 1007 days.

(21) Appl. No.: 10/095,653

(22) Filed: Mar. 8, 2002

Related U.S. Application Data

(60) Provisional application No. 60/274,456, filed on Mar. 9, 2001.

(51) Int. Cl.
*H03G 3/00* (2006.01)

(52) U.S. Cl. .......................................... 381/61; 381/17

(58) Field of Classification Search .................... 381/1, 381/17, 61, 63

See application file for complete search history.

(56) References Cited

U.S. PATENT DOCUMENTS

| | | | | |
|---|---|---|---|---|
| 4,237,343 A | 12/1980 | Kurtin et al. | | |
| 4,731,848 A * | 3/1988 | Kendall et al. | ............... | 381/63 |
| 4,817,149 A | 3/1989 | Myers | | |
| 5,436,975 A | 7/1995 | Lowe et al. | | |
| 5,812,674 A | 9/1998 | Jot et al. | | |
| 6,091,824 A | 7/2000 | Lin et al. | | |
| 6,188,769 B1 | 2/2001 | Jot et al. | | |
| 6,973,192 B1 * | 12/2005 | Gerrard et al. | ............... | 381/17 |
| 6,990,205 B1 * | 1/2006 | Chen | ........................... | 381/17 |

OTHER PUBLICATIONS

3D Working Group of the Interactive Audio Special Interest Group, 3D Audio Rendering and Evaluation Guidelines, Version 1.0, Jun. 9, 1998, revision 1, MIDI Manufacturers Association, Los Angeles.

3D Working Group of the Interactive Audio Special Interest Group, Interactive 3D Audio Rendering Guidelines, Level 2.0, Sep. 20, 1999, revision 1.0a, MIDI Manufacturers Association, Los Angeles.

* cited by examiner

*Primary Examiner*—Brian T. Pendleton
(74) *Attorney, Agent, or Firm*—P. Francois de Villiers

(57) ABSTRACT

A reverberation processing system simulates a sound scene that includes a plurality of related reverberant environments. The system includes a corresponding plurality of reverberation blocks that are fed by at least one source block. The reverberation blocks may include panning functionality to generate a perceived directional emphasis of the reverberation fields that are simulated by the reverberation blocks. The reverberation blocks may also include an auxiliary output that is used to feed related reverberation blocks, to simulate reverberation coupling between the reverberant environments.

20 Claims, 9 Drawing Sheets

METHOD AND APPARATUS FOR THE SIMULATION OF COMPLEX AUDIO ENVIRONMENTS

RELATED APPLICATION

This application claims the benefit of and priority to U.S. Provisional Patent Application No. 60/274,456 filed on Mar. 9, 2001, the disclosure of which is incorporated herein by reference as if explicitly set forth.

BACKGROUND OF THE INVENTION

Virtual auditory display systems (including for example computer games, virtual reality systems or computer music workstations) create virtual worlds in which a listener can hear sounds generated from sound sources within these worlds. In a computer game, the player hears the sound that he/she would hear if he/she were located in the position of the virtual listener in the virtual world. In a music production system, the composer or sound engineer can use an audio mixing system to create a recording that simulates multiple instruments located at different positions relative to the listener. Similarly, audio-visual systems for home use can recreate sonic environments that mimic real or artificial environments, such as a concert hall or jazz club. These sound processing systems are designed for playback over headphones or over a set of two or more loudspeakers.

In addition to reproducing sound emanating directly from a virtual source, such a system may also process the source signal to simulate the effects of the virtual environment on the sound emitted by the source. One important environmental factor is reverberation, which results from reflected sound paths off objects and boundaries in the environment.

As computer environments and entertainment systems become more sophisticated, it is desired to provide more sophisticated and accurate rendering of the sounds as heard in the virtual environments used by such systems.

SUMMARY OF THE INVENTION

According to one aspect of the invention, provided is a method of processing audio to account for the effect of a plurality of related environments on the sound perceived by a listener simulated to be in one of the environments, the method comprising:

- providing a first reverberation block for a first environment in which the listener is simulated to be located, the first reverberation block having an input and a multi-channel output;
- providing 1 to N further reverberation block(s) corresponding to 1 to N further environment(s) related to the first environment, each 1 to N further reverberation block(s) having an input and a multi-channel output;
- feeding a signal from a sound source into the first reverberation block and the 1 to N further reverberation block(s);
- determining, for each of the first reverberation block and the 1 to N further reverberation block(s), a reverberation coupling signal; and
- feeding the determined reverberation coupling signals to the inputs of related ones of the first reverberation and the 1 to N further reverberation block(s).

The step of feeding the determined reverberation coupling signals may include:

- applying, for each related reverberation block to which a particular reverberation coupling signal is provided, a transfer function to the particular reverberation coupling signal to account for the effect on the particular reverberation coupling signal of intervening structures.

Further, each of the first and the 1 to N further reverberation block(s) may comprise functionality for modifying its multi-channel output signal to provide perceived emphasis in a desired direction.

Still further, the transfer function may be provided by applying an adjustable gain and an adjustable low pass filter to the particular reverberation coupling signal.

Also, the step of feeding a signal from a sound source into the first reverberation block and the 1 to N further reverberation block(s) may include the application of a transfer function to the signal from the sound source and to each of the first reverberation block and the 1 to N further reverberation blocks.

Additionally, the transfer function that is applied to the signal from the sound source for each of the reverberation blocks may be provided by applying an adjustable gain and an adjustable low pass filter to the signal from the sound source.

According to another aspect of the invention, provided is an audio processing system that accounts for the effect of a plurality of related environments on the sound perceived by a listener simulated to be in one of the environments, the system comprising:

- a first reverberation block for a first environment in which the listener is simulated to be located, the first reverberation block having an input and a multi-channel output;
- 1 to N further reverberation block(s) corresponding to 1 to N further environment(s) related to the first environment, each 1 to N further reverberation block(s) having an input and a multi-channel output; and
- a sound source processing block to provide a signal to the first reverberation block and the 1 to N further reverberation block(s), wherein
- the first reverberation block and each 1 to N further reverberation block(s) are each operative to determine a reverberation coupling signal,
- the first reverberation block and each 1 to N further reverberation block(s) are each coupled to feed determined reverberation coupling signals to related ones of the first and the 1 to N further reverberation block(s).

The system may further comprise, for each related reverberation block to which a particular reverberation coupling signal is provided, a transfer function that is applied to the particular reverberation coupling signal to account for the effect on the particular reverberation coupling signal of intervening structures.

Further, each of the first and the 1 to N further reverberation block(s) may include functionality for modifying its multi-channel output signal to provide perceived emphasis in a desired direction.

The transfer function may comprise an adjustable gain and an adjustable low pass filter that is applied to the particular reverberation coupling signal.

Still further, the sound source processing block may include transfer functions that are applied to the signal for each of the first reverberation block and the 1 to N further reverberation blocks. The transfer functions may each comprise an adjustable gain and an adjustable low pass filter.

According to another aspect of the invention, provided is a method of processing audio to account for the effect of a plurality of related environments on the sound perceived by a listener simulated to be in one of the environments, comprising:

providing a first reverberation block for a first environment in which the listener is simulated to be located, the first reverberation block having an input and a multi-channel output;

providing 1 to N further reverberation block(s) corresponding to 1 to N further environment(s) related to the first environment, each 1 to N further reverberation block(s) having an input and a multi-channel output;

feeding a signal from a sound source into the first reverberation block and the 1 to N further reverberation block(s);

determining, for each of the 1 to N further reverberation block(s), a reverberation output signal; and determining a directional emphasis for each reverberation output signal; and providing each reverberation output signal to a multi-channel output, each reverberation output signal being modified in accordance with its determined directional emphasis.

The step of feeding a signal from a sound source into the first reverberation block and the 1 to N further reverberation block(s) may include applying a transfer function to the signal from the sound source for each of the first reverberation block and the 1 to N further reverberation blocks. The transfer function that is applied to the signal from the sound source for each of the reverberation blocks may be provided by applying an adjustable gain and an adjustable low pass filter to the signal from the sound source.

According to a further aspect of the invention, provided is an audio processing system that accounts for the effect of a plurality of related environments on the sound perceived by a listener simulated to be in one of the environments, comprising:

a first reverberation block for a first environment in which the listener is simulated to be located, the first reverberation block having an input and a multi-channel output;

1 to N further reverberation block(s) corresponding to 1 to N further environment(s) related to the first environment, each 1 to N further reverberation block(s) having an input and a multi-channel output; and a sound source processing block to provide a signal to the first reverberation block and the 1 to N further reverberation block(s), wherein each 1 to N further reverberation block(s) is operative to determine a reverberation output signal, each 1 to N further reverberation block(s) is operative to determine a directional emphasis for each reverberation output signal; and each 1 to N further reverberation block(s) is operative to provide its reverberation output signal to a multi-channel output, each reverberation output signal being modified in accordance with its determined directional emphasis.

The sound source processing block may include transfer functions that are applied to the signal for each of the first reverberation block and the 1 to N further reverberation blocks. The transfer functions may each comprise an adjustable gain and an adjustable low pass filter.

DETAILED DESCRIPTION OF THE INVENTION

Figure 1:
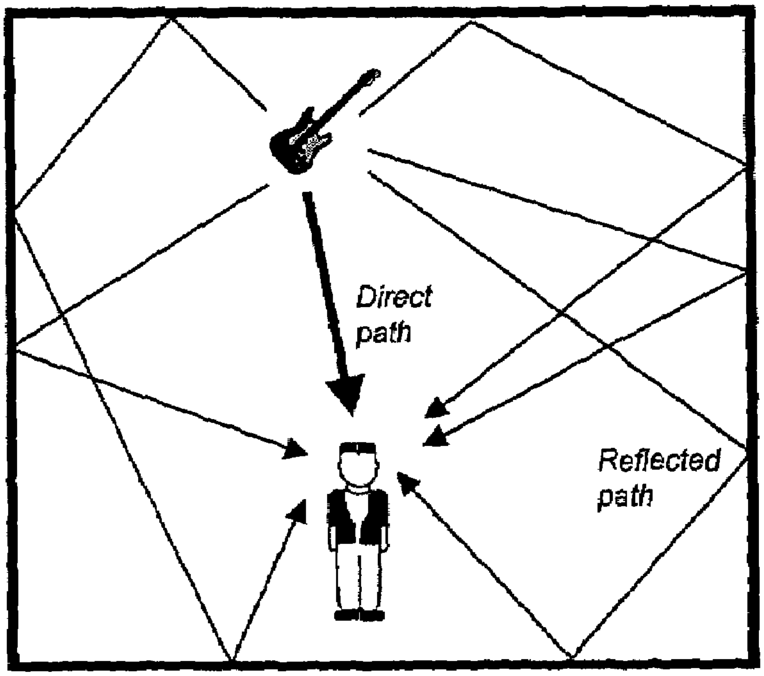
FIG. 1 is a schematic representation of a sound scene, showing sound paths from a source to a listener in a room (direct path and reflected paths)

As mentioned above, an important environmental factor in the perception of sound is reverberation, which results from reflected sound paths off objects and boundaries in the environment, as illustrated in FIG. 1

Figure 2:
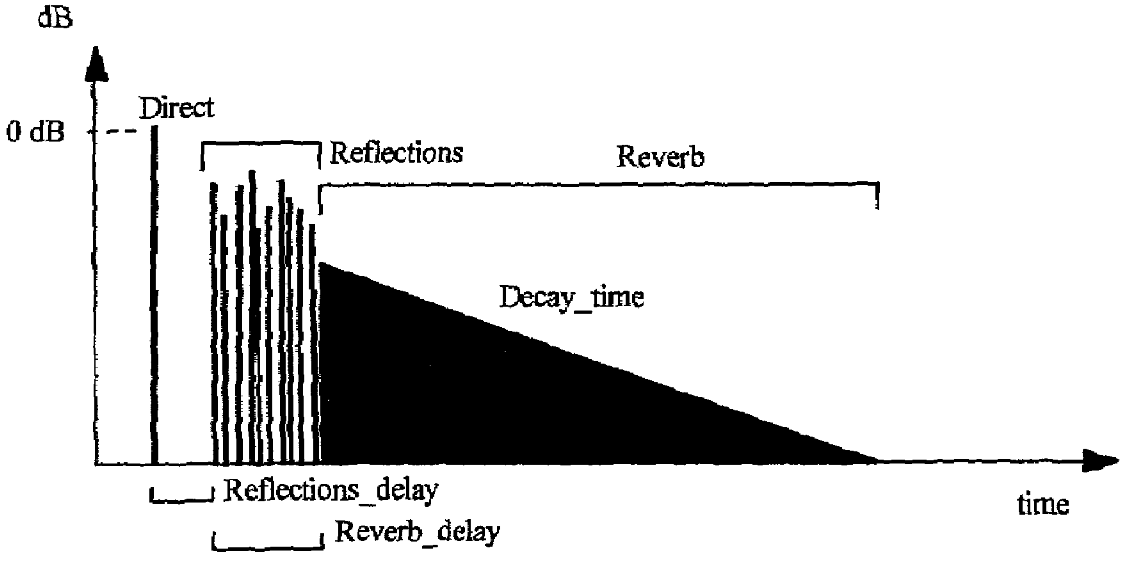
FIG. 2 is a graph that depicts an exemplary model of the impulse response for the sound scene of FIG. 1, combining all sound paths from a source to a listener in a room.

One exemplary method of modeling reverberation breaks the reverberation effects into separate time segments, as shown in FIG. 2. The first signal that reaches the listener is the direct-path signal, which undergoes no reflections. Subsequently, a series of "early" reflections are received during an initial period of the reverberation response. Finally, after a critical time, the "late" reverberation is modeled statistically because of the combination and overlapping of multiple reflections. The magnitudes of the delays from the initial direct-path signal and the arrival of the "early" and "late" reverberations are typically dependent on the size of the room and on the position of the source and the listener in the room. Reverberation can be characterized by such measurable criteria, another of which is the reverberation time, which is a measure of the time it takes for the reverberation to become imperceptible.

Figure 3:
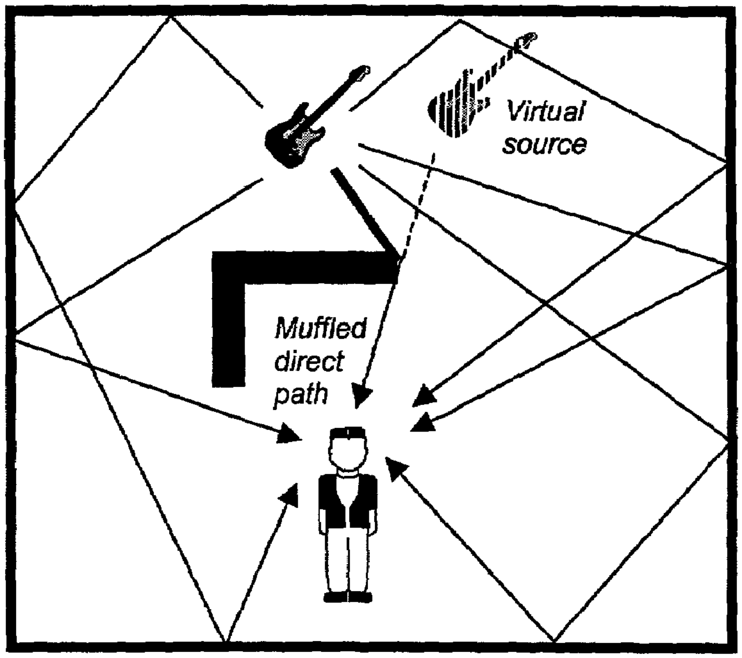
FIG. 3 is a schematic representation of a sound scene illustrating the obstruction of a sound source located inside the listener's room.

In a particular environment, there may be an obstacle between the source and the listener as shown in FIG. 3. In such a case, the corresponding audio effect is called "obstruction" and is reproduced by attenuating and filtering the direct-path sound while leaving the reflected sound (i.e. the reflections and the reverberation) unaffected.

Figure 4:
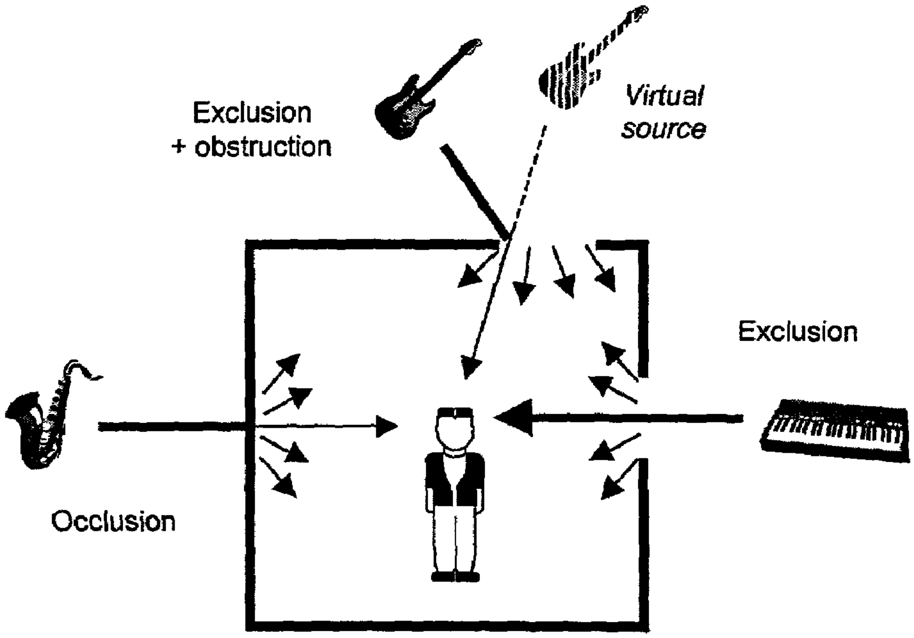
FIG. 4 is a schematic representation of a sound scene illustrating sound paths for sources located outside of the listener's room.

FIG. 4 shows a situation where a listener located in a room hears three sound sources located outside of this room. This situation illustrates two audio effects called "occlusion" and "exclusion". Occlusion occurs when both the direct-path sound from the source and the reflected sound generated by this source in the listener's room are attenuated and filtered due to transmission of the sound through a partition. Exclusion occurs when the direct-path sound from a source is received through an opening into the listener's room, but the reflected sound generated by this source in the listener's room is attenuated because the source is outside of the room. As illustrated in FIG. 1, exclusion can be combined with obstruction in the case of a source whose direct-path sound is attenuated by diffraction around the edge of the opening, and the sound then appears to emanate from a position that is different from the actual source position.

Figure 5:
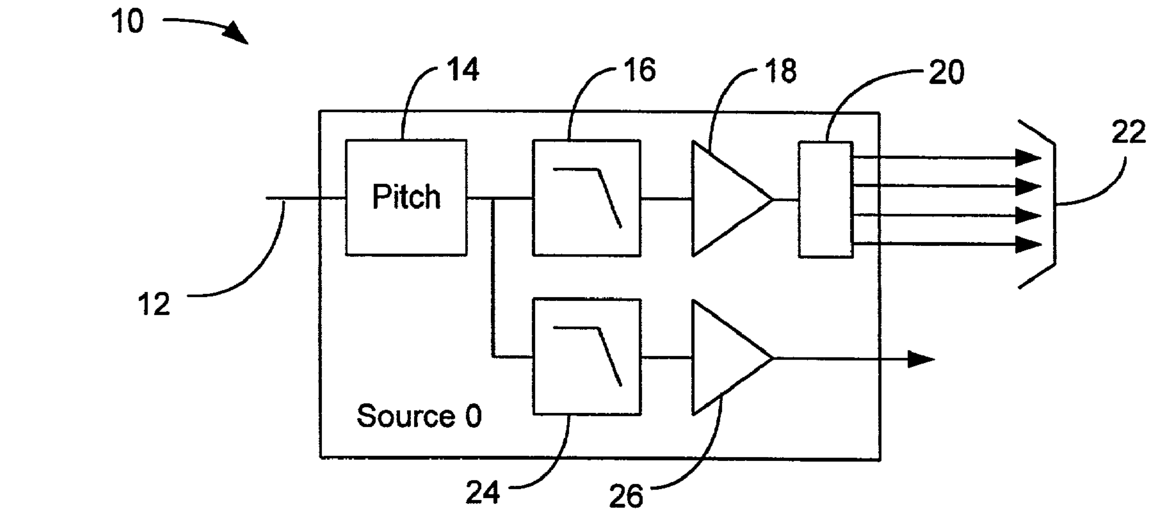
FIG. 5 is a schematic diagram illustrating a source block used for simulating a sound source.

FIG. 5 shows a source processing block 10 that is suitable for use in the reverberation processing system of the invention. The source processing block 10 receives an unprocessed audio signal (corresponding to a sound source in the virtual environment) at an input 12. The sound source may or may not be located in the same environment as the listener, and the source processing block 10 takes into account the effect of any intervening obstacles in the path between the sound source and the listener.

The audio signal is first optionally processed by a pitch shifting module 14, which can be useful for simulating an effect such as a Doppler effect. To process the "direct wave front" of the sound (as opposed to the reflections or reverberations), the audio signal is then passed to an adjustable low-pass filter 16 and an adjustable gain 18. The adjustable low-pass filter and the adjustable gain together form a transfer function that processes the audio signal to account for the effect of distance and intervening obstacles on the source signal. For example, if the sound source is located in an adjacent environment, it will be occluded if it passes through a partition (accounted for by the adjustable gain), with less of the higher frequencies being transmitted (accounted for by the adjustable low pass filter). Similarly, for a sound source located in the same environment as the listener, the low pass filter 16 and adjustable gain 18 can be used to account for the diffraction of the direct wave front around intervening obstacles. The particular parameters used for setting the adjustable gain 18 and the adjustable low pass filter 16 will in each case depend on the particular characteristics of the environment.

The audio signal is then passed to a panning module 20, which determines, from the location of the sound source relative to the listener, appropriate output levels for the different channels of a multi-channel output 22. The multi-channel output 22, after any necessary amplification, is provided to a multi-channel speaker system, headphones, or other audio output means such as the output to a recording system.

To permit reverberation and reflection processing, the audio signal is also passed to a further low pass filter 24 and adjustable gain 26. The low pass filter 24 and adjustable gain 26 provide a transfer function that feeds a reverberation block such as that shown in FIG. 6. One set of low pass filter 24 and adjustable gain 26 is provided for the reverberation block that simulates the reverberation in the environment in which the listener is "located," but, as will be apparent below, further sets of low pass filters 24 and adjustable gains 26 may be provided for further reverberation blocks that that are to be fed by the source processing block 10. The particular settings of the low pass filter 24 and the adjustable gain 26 provide and will again depend on the particular characteristics of the environment that is being simulated by the particular reverberation block. For example, the low pass filter 24 and adjustable gain 26 will be set to account for effects such as occlusion, air absorption, wall absorption, etc.

Figure 6:
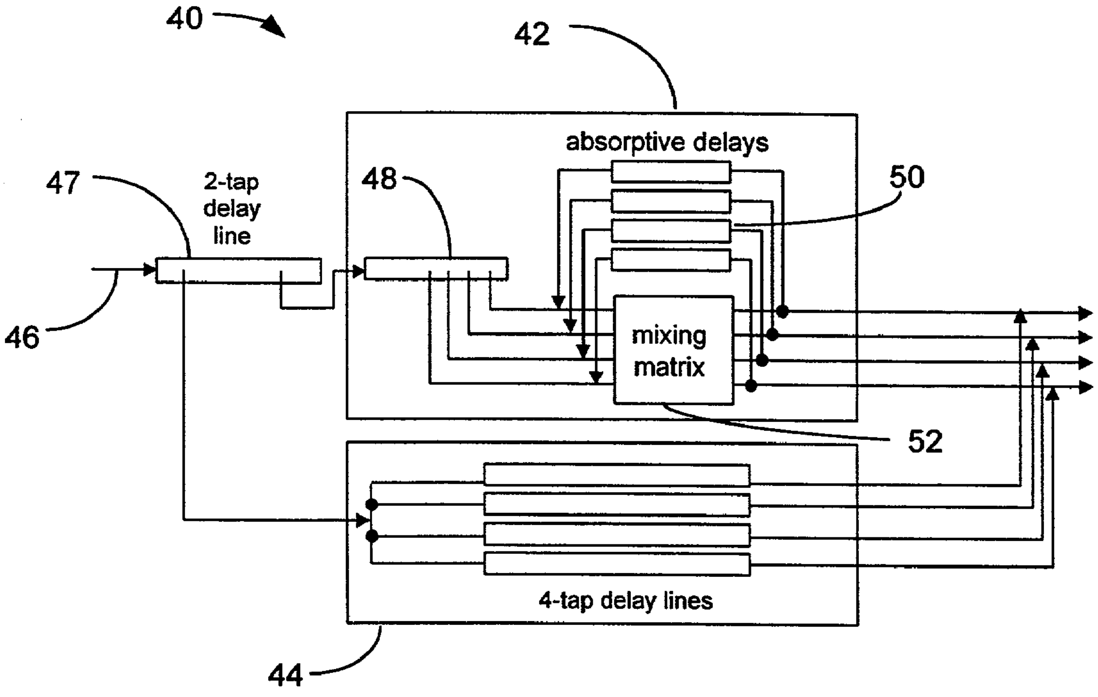
FIG. 6 is a schematic diagram illustrating a reverberation block that includes an early reflection block and a late reverberation block.

FIG. 6 shows a first embodiment of a reverberation block 40 that that is suitable for use in the reverberation processing system of the invention. The reverberation block 40 includes a late reverberation block 42 and an early reflections block 44, and receives a signal from one or more source blocks via an input 46. The input 46 is typically connected to the source block(s) via a reverberation bus (not shown in FIG. 6).

The signal received at input 46 is provided to a 2-tap delay line 47 that provides a delay equal to the "reflections_delay" time period shown in FIG. 2. One output from the 2-tap delay line 47 is then provided to the late reverberation module 42. The late reverberation block 42 includes a tap delay line 48 that provides the "reverb delay" time period shown in FIG. 2. The late reverberation block 42 further includes a mixing matrix 52, and a number of absorptive delays 50 that provide attenuated and delayed feedback signals to the mixing matrix 52. The mixing matrix 52 and the absorptive delays 50 together provide the sloped reverberation signal in FIG. 2 that decays over the time period "decay_time." The late reverberation block 42 provides a multi-channel output that is summed with the multi-channel output from the reflections module 44.

The early reflections block 44 comprises a plurality of 4-tap delay lines that provide different delays to the signal received from the 2-tap delay line 47, to provide a series of reflection signals as shown in FIG. 2. The multi-channel output from the early reflections block 44 is added to the output from the late reverberation block 42, to form the multi-channel output of the reverberation block 40. The early reflections block 44 and the late reverberation block 42 typically produce weakly correlated signals of similar energy, so as to produce for the listener the sensation of being evenly surrounded by reflected sound.

Further details of source and reverberation processing blocks that may be used in the invention can be found in U.S. Pat. No. 6,188,769 to J.-M. Jot, commonly-assigned with the current application, the disclosure of which is incorporated herein by reference as if explicitly set forth.

Figure 7:
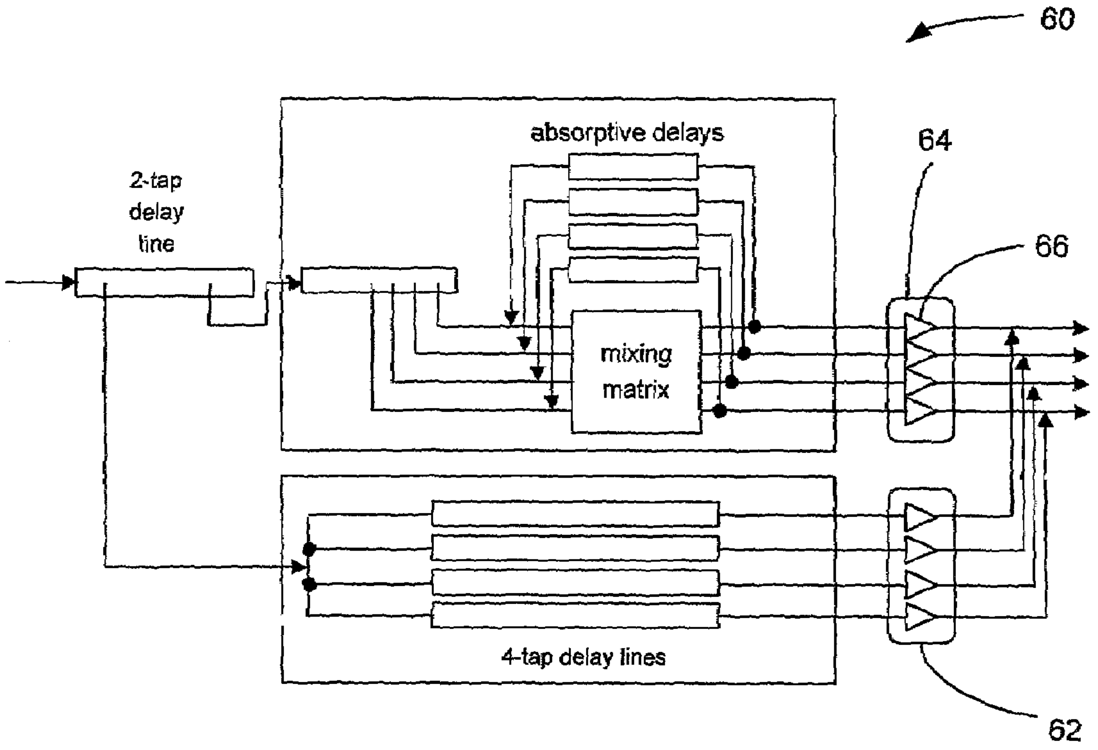
FIG. 7 is a schematic diagram illustrating a reverberation block that includes an early reflection block, a late reverberation block, an early reflection panning block and a late reverberation panning block.

An alternative embodiment 60 of a reverberation block that is suitable for use in the reverberation processing system of the invention is shown in FIG. 7. In addition to the structure described above with reference to FIG. 6, the reverberation block 60 includes an early reflection panning block 62 and a late-reverberation panning block 64. The panning blocks 62, 64 include an adjustable gain 66 for each channel of the multi-channel output, and are used for emphasizing the amount of reflections or reverberation in a chosen direction relative to the listener. A reverberation block including panning blocks was introduced in Fall 1999 in the SoundBlaster™ Live! (a multimedia PC sound card manufactured by Creative Labs) and has also appeared recently in some multi-channel reverberation units used in sound recording studios. The ability to "pan" the early reflections and/or the late reverberation is useful, for example, to improve the realism of the audio simulation in situations where the virtual listener approaches a wall of the virtual room. In such a situation, the stronger early reflections typically emanate from the closest walls, while the late reverberation may be distributed differently.

Assuming a four-channel loudspeaker layout, the panning blocks in FIG. 3 can be controlled via a 2-D "pan vector" denoted Pan=($Pan_x$, $Pan_y$) and implemented by combining a left-right balance control (x direction) and a front-back balance control (y direction). The gains $g_i$ in a panning block can be derived from the coordinates $Pan_x$ and $Pan_y$, of the pan vector as follows:

$$g_1^2=(1+Pan_x)(1-Pan_y)/4;\ g_2^2=(1+Pan_x)(1+Pan_y)/4;$$

$$g_3^2=(1-Pan_x)(1+Pan_y)/4;\ g_4^2=(1-Pan_x)(1-Pan_y)/4;$$

where $-1\leqq Pan_x\leqq 1$, $-1\leqq Pan_y\leqq 1$ and $(Pan_x^2+Pan_y^2)\leqq 1$.

In this manner, the direction of the pan vector corresponds to the apparent direction of the reflections or the reverberation relative to the listener, and the magnitude of the pan vector controls the amount of emphasis (or focus) in that direction. A magnitude of 0 means that the reflected sound is evenly distributed around the listener. A magnitude of 1 means maximum emphasis (or focus) in the chosen direction.

Figure 8:
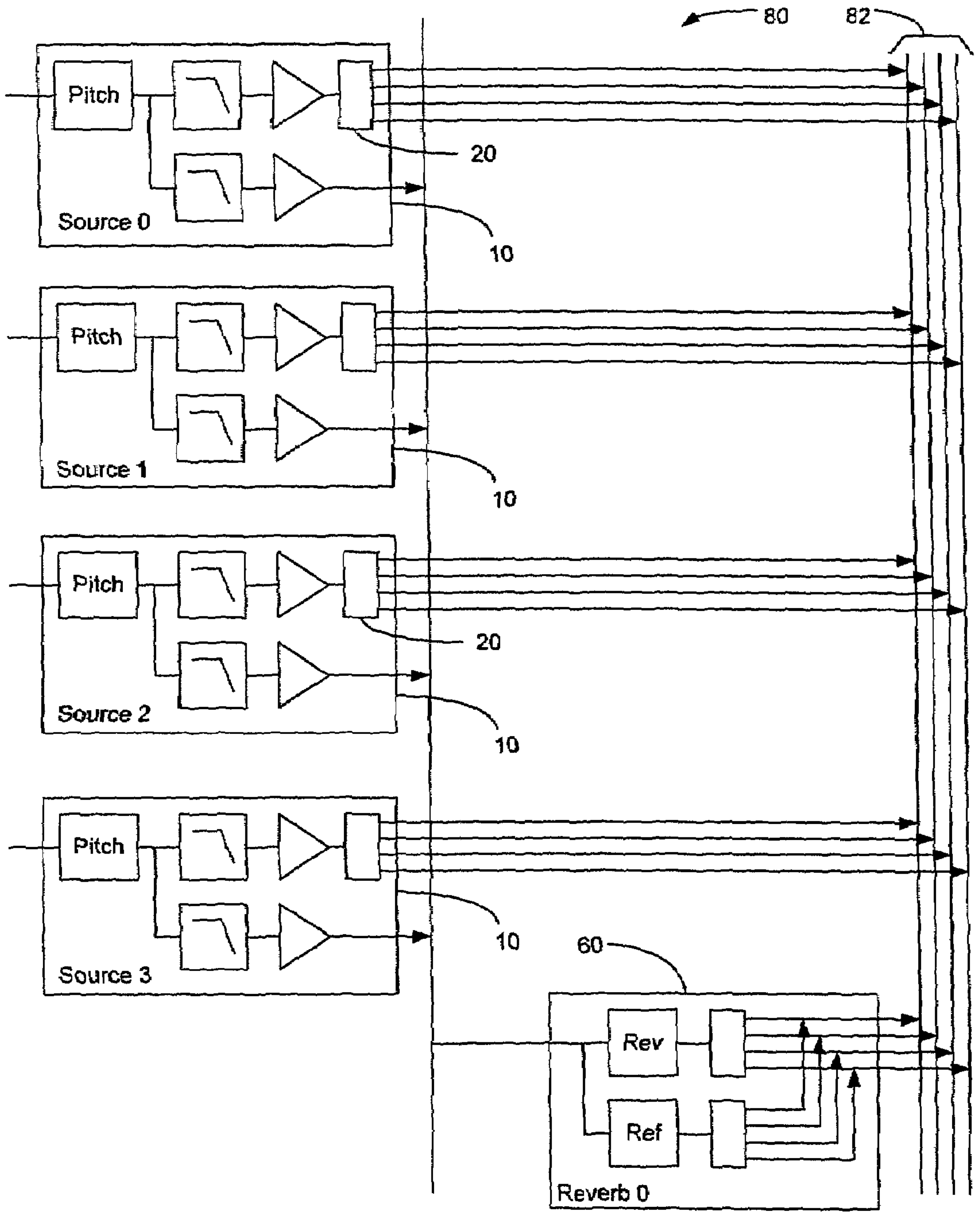
FIG. 8 is a schematic diagram illustrating a multiple-source processing system utilizing the source and reverberation blocks of FIGS. 6 and 7.

FIG. 8 shows a reverberation processing system 80 suitable for simulating multiple sound sources located inside or outside of the virtual listener's room, as shown in FIGS. 1, 3 and 4. A plurality of source blocks 10 are provided, and each source block 10 feeds a multi-channel output bus 82 via a panning block 20, which controls the apparent direction of the source relative to the listener. A single reverberation block 60 is used to reproduce the reverberation generated in the listener's environment by the sound sources. Each source signal, after passing through an adjustable gain 24 and adjustable low-pass filter 26 (see FIG. 5) is summed into the input 46 of the reverberation block 60, In this example, a four channel multi-channel output 82 is provided, which is ultimately reproduced over a set of four loudspeakers located around the listener.

When only one reverberation block is used, as shown in FIG. 8, the result is equivalent to simulating a reverberant environment that is surrounded by non-reverberant environments. That is, sounds received from a source outside the listener's environment sound as though they were outdoors, while such a source may in fact itself be in a reverberant environment such as an adjacent room or corridor. Although the combination of obstruction, exclusion and occlusion as defined above can account for the attenuation and muffling effects applying to the first wave front received from each source by the listener or fed into the listener's environment, the system cannot provide a realistic simulation of a complex virtual 3-D audio environments that includes multiple interconnected reverberant environments.

Examples of the limitations of using a single reverberation-block system are:

1. Sources heard from adjacent rooms. A sound coming from an adjacent room through an opening or through a partially occluding partition will not be accompanied by the sound of the reverberation existing in this adjacent room. This sounds as if the source is outside instead of being in a room itself. If, due to intervening obstacles, the direct-path sound is too weak, the sound may not be heard even though an opening may exist between the two rooms.

2. When a listener transitions between environments. When the listener walks from room A to room B, the only possibility is to operate a "morphing" on the parameters of the (unique) reverberation block. This can sound unnatural if the two rooms have very different reverberations.

3. A source entering or leaving the listener's environment. When a source enters the listener's environment, it becomes suddenly more reverberated (because it is no longer excluded from the room containing the listener). This is not natural if the source comes from a reverberant room, which is very often the case in typical scenarios (a corridor for instance). Conversely, when a source leaves the listener's room, it is suddenly no longer reverberated.

4. A listener and a source in two rooms connected through a third room (e.g. a corridor). Even if there is no audible direct-path sound, the listener should be aware of the presence of the source because of the reflections and reverberation propagating from the initial room to the listener's room.

5. A listener making a loud sound near the entrance to a reverberant environment (e.g. shouting near the entrance to the bathroom from the living room). The sound should feed the reverberation of the adjacent environment (bathroom) through the opening and this reverberation should be heard coming back from the opening. This can be simulated with the system of FIG. 8 only if the virtual listener is located in a non-reverberant environment (e.g. at an outside entrance to a cave or a tunnel).

Figure 9:
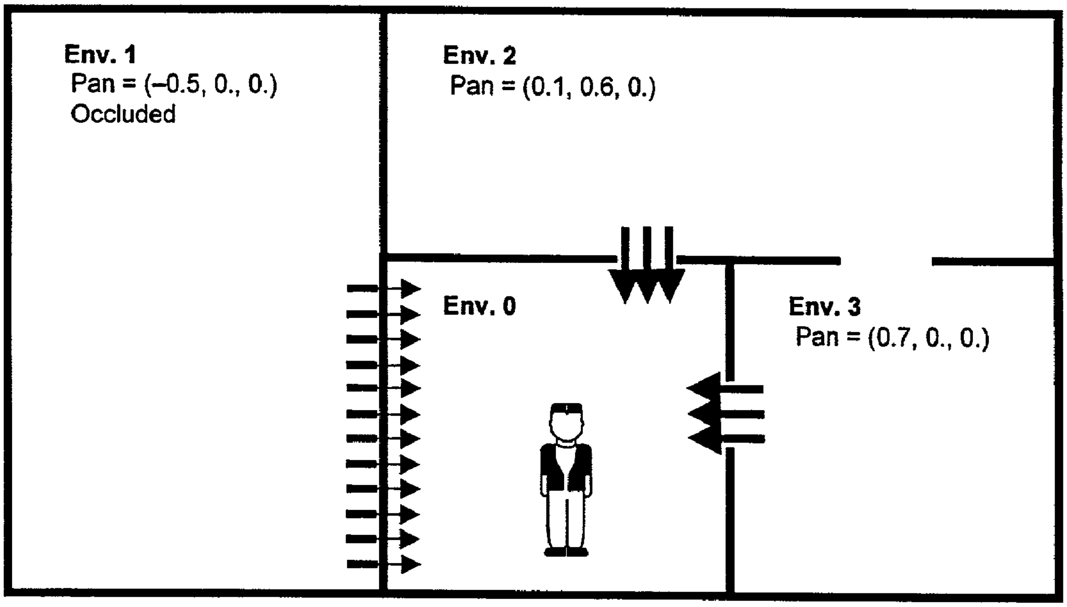
FIG. 9 is a schematic representation of a sound scene, showing reverberation signals emanating from multiple rooms and including reverberation panning.
Figure 11:
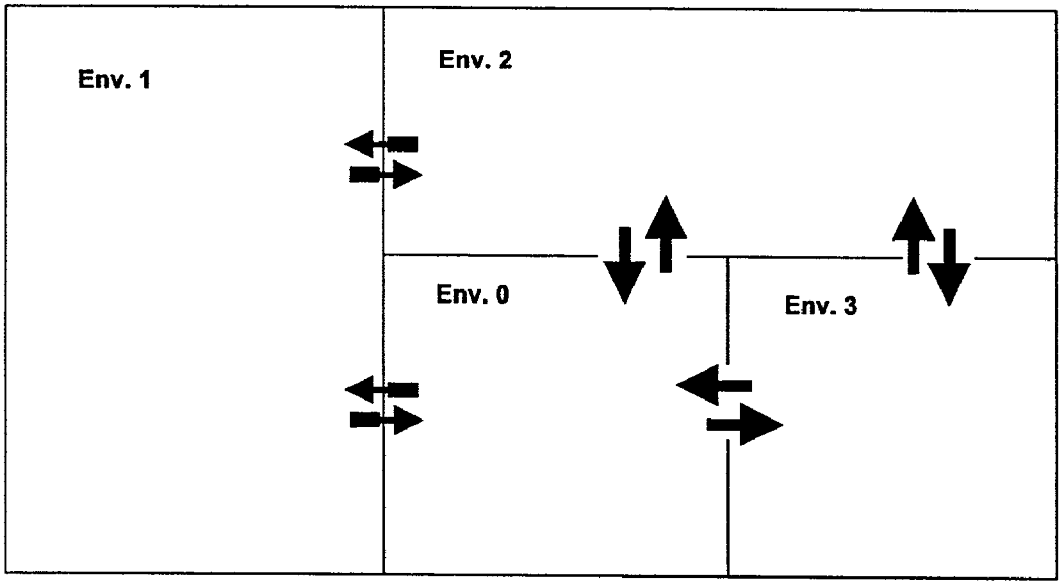
FIG. 11 is a representation of the sound scene of FIG. 9, illustrating the transmission of reverberation energy between multiple rooms.

Starting from the scenarios illustrated in FIGS. 1, 3 and 4, where only the listener's room is accounted for, a more complete model that accounts for the presence of several adjacent environments can be explained using the principle of superposition in two steps, illustrated in FIGS. 9 and 11.

FIG. 9 shows the room of FIG. 4, denoted Env. 0, surrounded by three adjacent rooms (Env. 1, Env. 2, Env. 3), each containing one of the three sound sources shown in FIG. 4, as well as a sound source in Env. 0, where the listener is located. The sound field in Env. 0 can be characterized by assuming that each source emits an impulse signal. To model the complete sound field, we first recognize that, in the absence of reverberation in any of the adjacent rooms, each source would only generate a single or direct wave front. The resulting sound received by the listener would be the combination of the direct-path sound received from each source and the reverberation generated in Env. 0 by each source's direct wave front. This is illustrated by the diagram of FIG. 4 and is accounted for by the audio processing system of FIG. 8.

To apply the principle of superposition, firstly the additional sound components that are received by the listener are now identified, taking into account that the three "outside" sources are themselves located in reverberant environments (the rooms) as shown FIG. 9. The additional sound components result from the reflected wave fronts generated in each of the adjacent rooms. That is, there is a reverberation sound field in each of these rooms, fed by the source located in it. Each of these reverberation fields can be perceived by the listener through an opening or a partition. Therefore, unlike the reverberation of Env. 0, which surrounds the listener, the reverberations of Env. 1, 2 or 3 emanate from the direction of the corresponding opening (Env. 2 or 3) or from the wall through which it is transmitted (Env. 1). In order to simulate these additional sound components, the system of FIG. 8 is extended with three reverberation blocks that represent the three reverberant environments that surround the environment in which the listener is located. Each of these reverberation blocks typically includes one or more panning blocks for controlling the emphasis (or focus) of the reflections and reverberation in a desired direction. It is also noted that the reverberation coming from Env. 1 is muffled (occluded) due to transmission through a wall.

Figure 10:
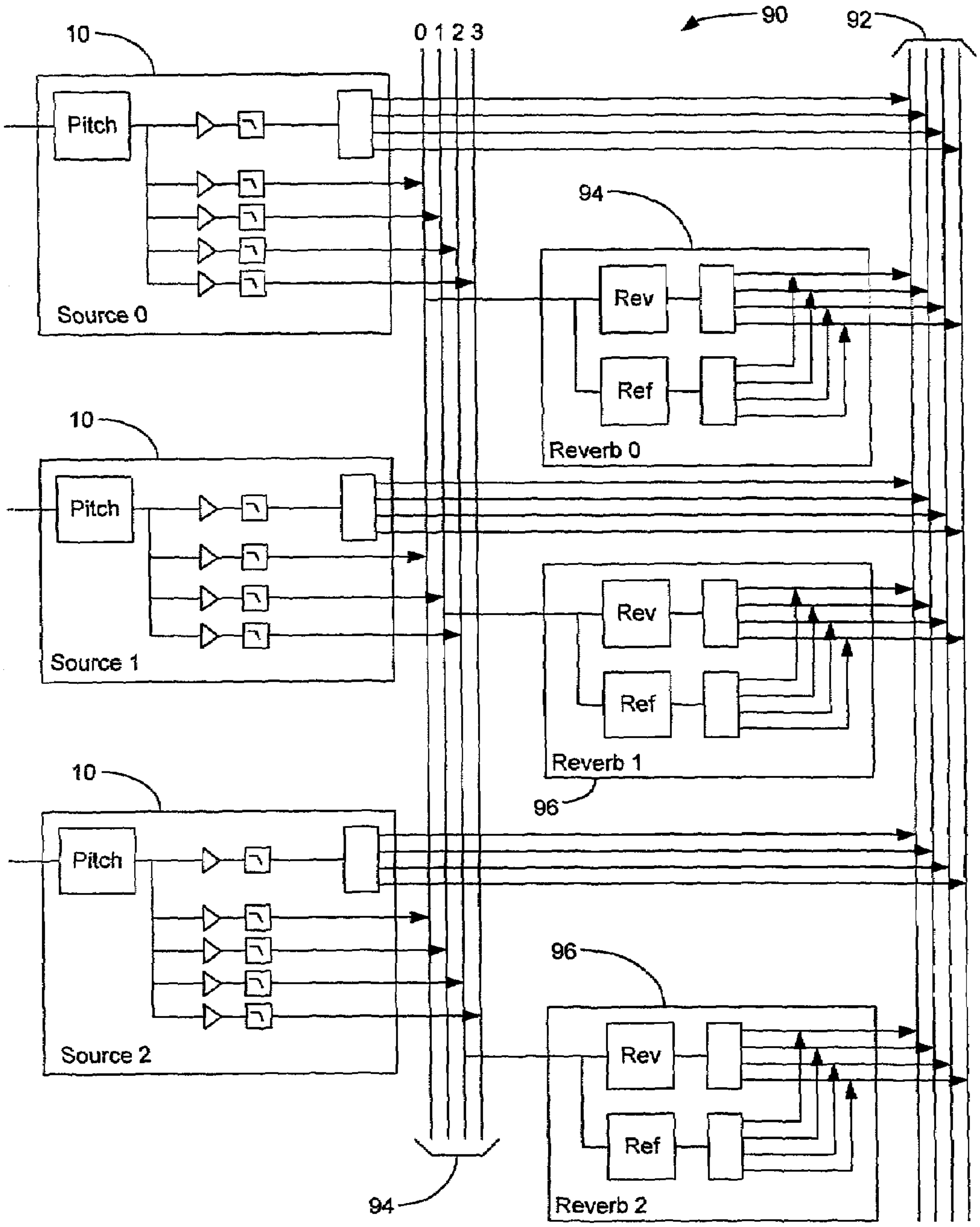
FIG. 10 is a schematic diagram illustrating a reverberation processing system for simulating multiple sound sources in multiple rooms, including reverberation panning.

FIG. 10 shows a reverberation processing system 90 that is suitable for simulating multiple sound sources located in reverberant environments outside of the virtual listener's room, as shown in FIG. 9. A plurality of source blocks 10 are provided, and each source block 10 feeds a multi-channel output bus 92 in the same manner as the system of FIG. 8.

One reverberation block 94 is used to reproduce the reverberation generated in the listener's environment by the sound sources, while one or more further reverberation blocks 96 are used to reproduce the reverberation generated in environments in which the listener is not located. Each signal from a source block 10, after passing through an adjustable gain 26 and adjustable low-pass filter 24 (see FIG. 5) is also summed into the inputs of relevant or related reverberation blocks 94, 96. These signals are passed over a reverberation bus 98, the links of which have been numbered to identify the corresponding reverberation block.

The signals from the source blocks 10 are passed to related or relevant reverberation blocks 94, 96. For example, using source block numbering, reverberation block numbering, and environment numbering that corresponds, it can be seen that source 0 feeds reverb blocks 0, 1,2 and 3, since source 0 is located in Env. 0, and is related to Envs. 1,2 and 3. Similarly, source 1 feeds only reverb blocks 0, 1, and 2, since source 1 is not related to (i.e. does not provide energy directly to) Env. 3. Note that because of space considerations, source 3 and reverb 3 are not shown in FIG. 1, but the reverb bus link corresponding to reverb 3 is shown. Note further that for the purposes of FIG. 10, we have assumed for simplicity of illustration that a source does not feed directly into non-adjacent rooms. That is, source 1 in Env. 1 is not loud enough to feed directly into Env. 3. Depending on the circumstances, this may in fact take place, and can be accounted for by providing source input to the relevant reverberation block.

Each of the reverberation blocks 94, 96 in FIG. 10 includes one or more panning blocks for controlling the emphasis (or focus) of the reflections and reverberation in a desired direction. This is particularly relevant in the case of the reverberation blocks 96 that correspond to Envs 1, 2 and 3. As can be seen from FIG. 9, the perceived sound from the reverberation fields in Envs. 1, 2 and 3 will be more directional than the perception of the reverberation field in Env. 0, which may appear to surround the listener. For this reason, in an alternative embodiment, panning blocks may not be provided for the reverberation block 94 that corresponds to the environment in which the listener is located.

As before, a four channel multi-channel output 92 is provided, which is ultimately reproduced over a set of four loudspeakers located around the listener.

To apply the second part of the principle of superposition, it is noted that the reverberation coming from each of the adjacent environments also contributes to the reverberation field generated in the listener's room (Env. 0). Conversely, the reverberation in Env. 0 contributes to the reverberation fields in Env. 2 and 3. Similarly, the reverberation fields in Env. 2 and Env. 3 interact with each other. This phenomenon is called "reverberation coupling" and is shown in FIG. 11, which shows the exchange of energy between the reverberations of adjacent environments through openings or partially occluding walls. We note that the reception of reverberation energy by Env. 1 from its adjacent environments may be neglected in comparison to other phenomena without an objectionable effect on the simulation if sound transmission through the corresponding partitions is small. Similarly, the reception of reverberant energy by Env. 2 from Env. 1 may be neglected in comparison to other phenomena without an objectionable effect on the simulation if sound transmission through the corresponding partitions is small. Note that FIG. 11 shows only the exchange of relevant energy between reverberation fields, and not the direct wave fronts from the various sources.

Figure 12:
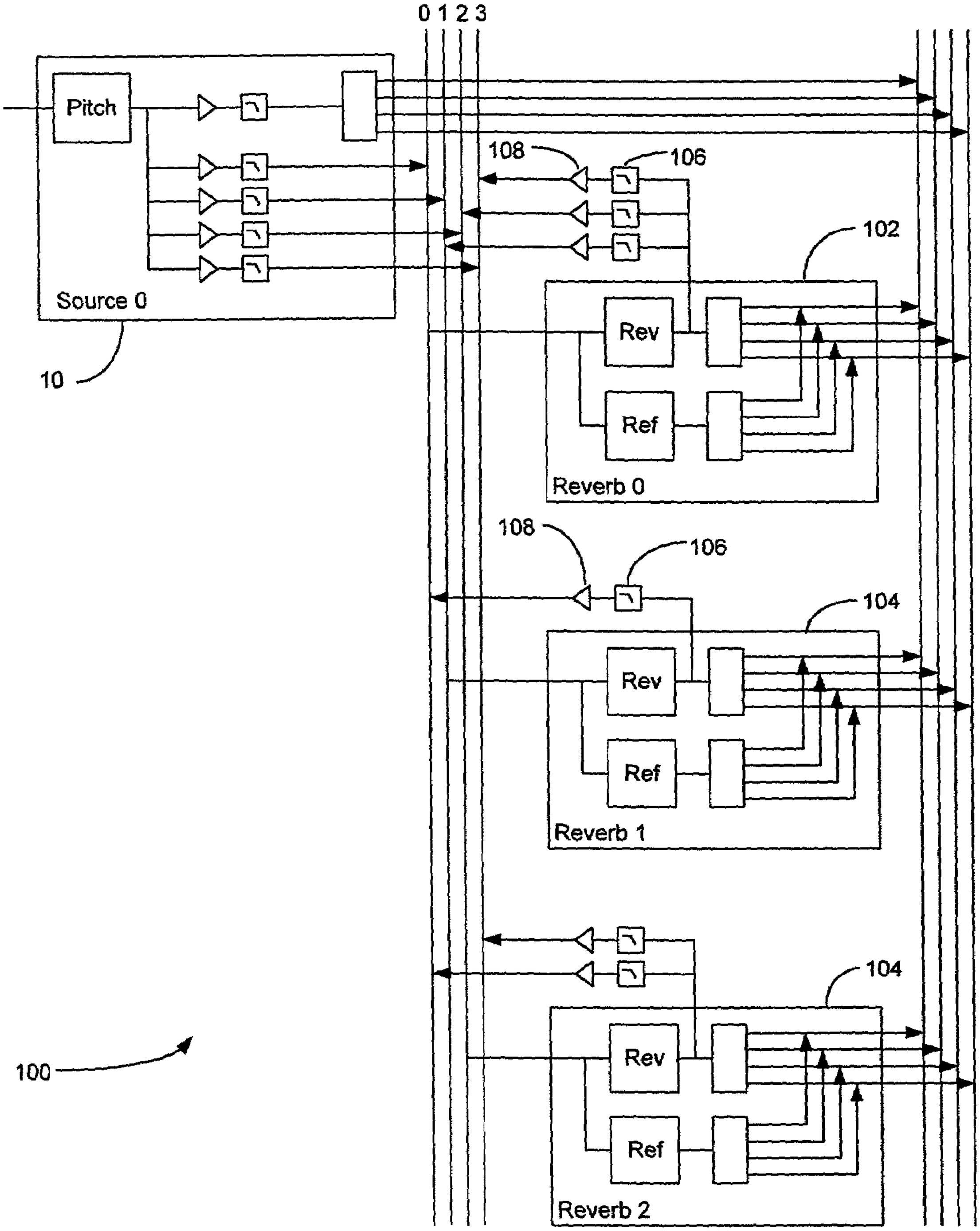
FIG. 12 is a schematic diagram illustrating a reverberation processing system for simulating multiple sound sources in multiple rooms, including reverberation panning and reverberation coupling.

FIG. 12 shows a preferred embodiment of the reverberation processing system, which accounts for all of the components of the sound field described above. The reverberation processing system 100 of FIG. 12 includes:

1. Several reverberation blocks, including a reverberation block 102 that is used to reproduce the reverberation generated in the listener's environment by the sound sources, with one or more further reverberation blocks 104 that are used to reproduce the reverberation generated in environments in which the listener is not located. That is, instead of a single room attached to the listener, the system 100 can simulate multiple rooms heard concurrently by the listener. Each reverberation block includes panning modules for providing directional emphasis to the early reflections and the late reverberation, in accordance with the acoustical model of FIG. 9.

2. The ability for any reverberation block 102, 104 to feed an amount of energy into another reverberation block 102, 104, with optional low-pass filtering 106 and adjustable gain 108 to account for the effect of intervening structures. The feedback of reverberation energy simulates reverberation coupling as discussed above with reference to FIG. 11. The system 100 of FIG. 12 shows the reverberation coupling relationship between the environments illustrated in FIG. 11. The reverberation block 102 (Reverb 0) provides reverberation coupling energy to all three of the reverberation blocks representing Envs. 1, 2 and 3 (Reverb 3 not shown due to space constraints), while Reverb 1 only provides reverberation coupling energy to Reverb 0.

3. The ability for any source 10 to feed into several reverberation blocks, with different adjustable gains 26 and different amounts of low-pass filtering 24 (see FIG. 5). This is necessary because, typically, a source in another room may feed both that environment and the listener's environment (through an opening or by transmission through a wall). Note that in FIG. 12 only one of the multiple sources has been illustrated due to space constraints.

Figure 13:
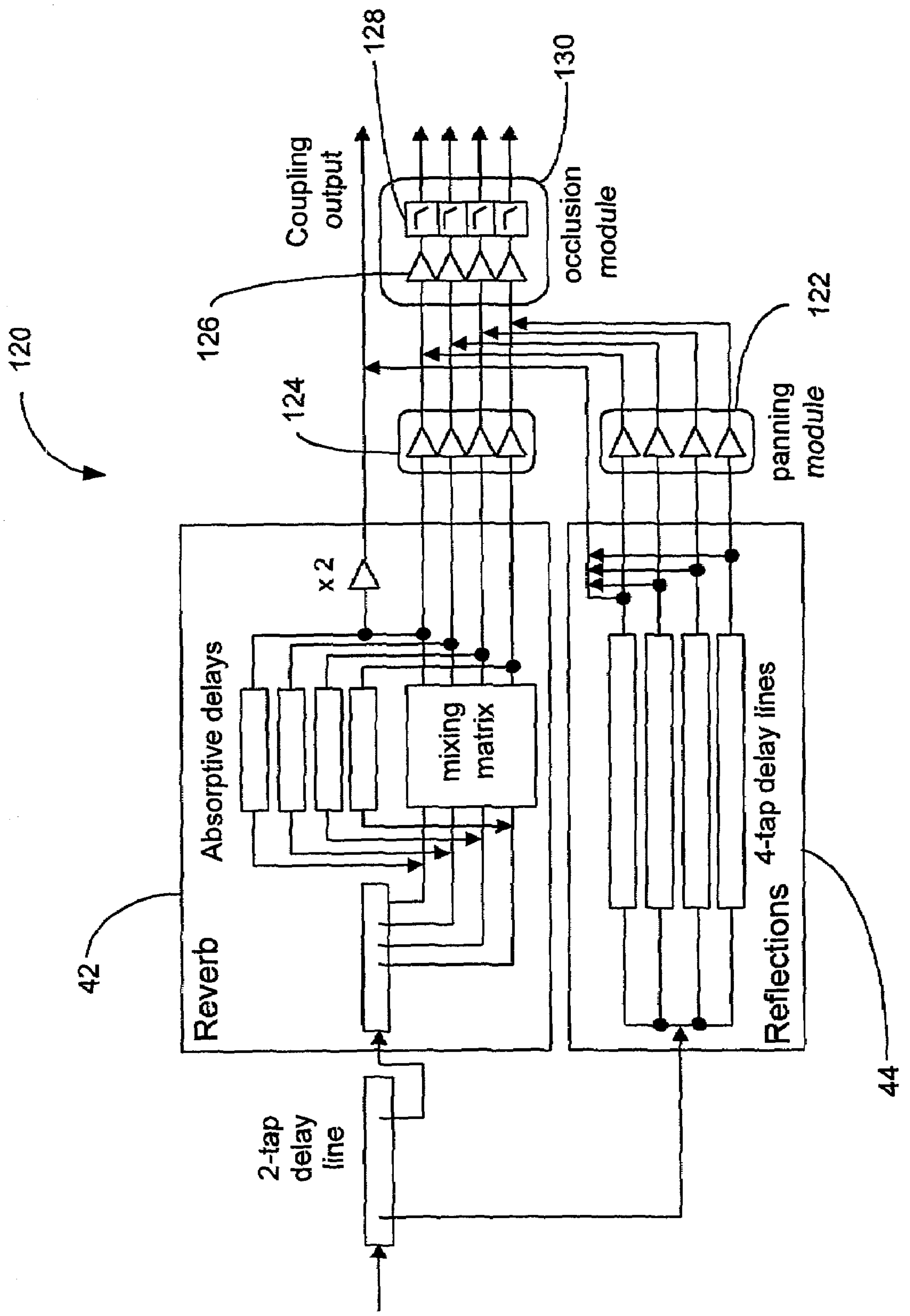
FIG. 13 is a schematic diagram illustrating a preferred reverberation block for use in the system of FIG. 12.

A preferred reverberation block 120 that is suitable for use in the system 100 of FIG. 12 is illustrated in FIG. 13, and it has four features that are not used in a system using a single reverberation block to simulate the listener's environment alone:

1. Directional panning blocks 122, 124 that provide directional panning of both the early reflections and the late reverberation. This provides control over both the direction of incidence and the amount of focus in that direction. For a reverberation component heard through an opening or partition, these two parameters will depend on the position of the opening or partition relative to the virtual listener and on its dimensions. For instance, in the case of a listener walking towards a narrow entrance to an adjacent room, the reverberation from that room will be initially focused in the direction of the opening. As the listener approaches the opening, the reverberation from the adjacent room will span a wider angular range of incidence around that direction (resulting in a reduced focus). Eventually, as the listener enters the room, its reverberation will surround the listener (resulting in no focus).

2. Adjustable gains 126 for attenuating the reverberation signal according to the location and size of the opening or partition through which the reverberation is heard. The intensity of the reverberation emanating from an adjacent room through an opening or partition will depend on the position of the opening or partition relative to the virtual listener and on its dimensions. The reverberation signal will be more intense if the listener is closer to the opening, if the opening is larger and if it is directed towards the listener rather than away from the listener.

3. Low pass filters 128 for muffling (or occluding) the reverberation signal if it is transmitted trough a partially absorptive partition before reaching the listener (a closed door for instance) or if it is partially blocked by an obstacle standing between the opening and the listener.

4. The provision of an auxiliary output signal suitable for reverberation coupling. The power spectrum of the auxiliary reverberation signal should be equal to the total power of the multi-channel reverberation output signal. It represents the intensity of the reverberation signal in the originating room and should not be affected by the position of the listener or by intervening partitions or obstacles.

In practice, the scaling (adjustable gains 126) and filtering (low pass filters 128) operations included in the occlusion module 130 can be merged into the early reflection and late reverberation modules or into their corresponding panning modules.

In the preferred reverberation block 120 shown in FIG. 13, the auxiliary reverberation output signal is derived as follows:

1. The early reflection block 44 produces an auxiliary early reflection output signal equal to the sum of the four main reflection output signals before these are fed to the early reflection panning module and the occlusion module.

2. The late reverberation block 42 produces an auxiliary late reverberation output signal that is simply tapped from one of the four late reverberation output signals (not scaled by the late reverberation panning module or the occlusion module). The tap from one of the four late reverberation signals is multiplied by 2 (i.e. its power is multiplied by 4) to match the total signal power of the four main late reverberation output signals.

3. The two resulting signals are added so that the total auxiliary reverberation output signal produced by the reverberation block is the sum of the auxiliary output signals produced by the early reflection block and the late reverberation block.

In a practical application of the reverberation processing system, a set of control parameters are defined that can be used in order to control the audio effects produced by the audio processing system. The parameters can be used by the developer of a computer game or virtual reality system, or by a musician or sound engineer for producing a recording or by a user for playback.

Table 1 below shows exemplary control parameters for use with the audio processing system of the invention.

The control parameters can be grouped into four categories: Environment Parameters, Environment Coupling Parameters, Source Parameters, and Listener Parameters. For simplicity, only the parameters relevant to reverberation rendering are reviewed in Table 1, the other parameters and their implementation being known to a person of ordinary skill in the art. Each of these parameters is defined below in more detail, along with a review of the positional parameters that are necessary to define the sound scene. The value of a parameter at high frequencies is defined as the value of this parameter at a chosen reference frequency (typically equal to 5 kHz).

Environment Parameters

There is one set of Environment Parameters for each reverberation block.

These parameters include six reverberation parameters already defined for the single reverberation block model described in U.S. Pat. No. 6,188,769:

Reflections: the signal power of the early reflections, measured in dB,

ReflectionsDelay: the delay of the first reflection relative to the direct path, Reverb: the signal power of the late reverberation at low frequencies, measured in dB, ReverbDelay: the delay of the late reverberation relative to the first reflection, DecayTime: the time it takes for the late reverberation to decay by 60 dB at low frequencies, DecayHFRatio: the ratio of the high-frequency decay time relative to the low-frequency decay time.

In addition to the above six parameters, the following Environment parameters are included in the preferred embodiment of FIGS. 12 and 13.

ReflectionsPan and ReverbPan: panning vectors that control the early reflection panning module and the late reverberation panning module, respectively. As mentioned earlier, the magnitude of a panning vector defines the amount of focus in the direction of this vector.

Room: attenuation value that controls the adjustable gains in the occlusion module of the reverberation block (measured in dB).

RoomHF: attenuation value at high frequencies relative to low frequencies that controls the low pass filters in the occlusion module of the reverberation block (measured in dB).

Occlusion and OcclusionLFRatio: these two parameters are defined in U.S. Pat. No. 6,188,769 for a sound source and are defined similarly here for an environment. These parameters control the adjustable gains and low pass filters in the occlusion module of the reverberation block to provide a muffling effect. Occlusion is the amount of attenuation at high frequencies due to the occlusion effect (measured in dB), while OcclusionLFRatio is the relative attenuation at low frequencies. The effect on these two parameters combines additively (in dB) with the effect of the Room and RoomHF parameters.

Environment Coupling Parameters

There is one set of Environment Coupling Parameters for each possible connection from one reverberation block into another:

EnvironmentIDFrom and EnvironmentIDTo: identify the source and target reverberation blocks for the Environment Coupling connection.

Room and RoomHF: define the attenuation at low and high frequencies that control the gain and filter on each of the reverberation coupling paths in FIG. 12 (measured in dB).

Source Parameters

There is one set of Source Parameters for each virtual sound source in the virtual world. This set of parameters includes the position coordinates of the source in the virtual 3-D world, and can also include its orientation and a model of its directivity. The Source Parameters shown in Table 1 affect only the contribution of the source into each of the reverberation blocks. For simplicity, it is generally sufficient to account only for the contribution of a sound source to the reverberation of the room where it is located and for its contribution to the reverberation of the listener's room (which may be the same), although the contribution of the sound source could be extended to the reverberation fields of other environments if desired.

With this assumption, a preferred set of control parameters relevant to these contributions is:

EnvironmentID: This parameter identifies the reverberation block corresponding to the Environment where the source is located.

Room and RoomHF: These parameters control the signal power at low and high frequencies provided by the source to the environment where it is located (measured in dB).

Occlusion, OcclusionLFRatio, Exclusion and ExclusionLFRatio: These are occlusion and exclusion parameters for a source not located in the listener's environment.

If the source is located in the listener's environment, it will contribute only to the input signal of the corresponding reverberation block. The Room and RoomHF parameters are sufficient to control this contribution and the occlusion and exclusion parameters need not be used.

If the source is located in an environment different from the listener's, the Room and RoomHF parameters control the contribution of the source to the reverberation module corresponding to that environment. The Occlusion and Exclusion parameters can then be used to control the contribution of the source to the listener's environment.

The Source Parameters thus also provide means for indicating what amount of attenuation or low-pass filtering must be applied on the signal path from the source to the reverberation block that accounts for the reflections and reverberation generated in the listener's room, thereby facilitating the support of per-source occlusion or exclusion effects.

Listener Parameters

There is one set of Listener parameters. The set can include the position and orientation of the virtual listener in the virtual world. Furthermore, in order to determine the contribution of each source to the different reverberation blocks according to the above scheme, it is necessary to identify which of the reverberation blocks, if any, is associated with the listener's room. For this purpose, the Listener object includes an EnvironmentID property, which must be set to the EnvironmentID of the environment in which the listener is located.

While it may appear restrictive to assume that a source can only feed an environment different from the listener's if it is actually located in that environment, it is possible artificially to create a duplicate of a source to feed environments not otherwise fed. For this duplicate source, the Source Parameters settings can be chosen in order to contribute a desired amount into any reverberation block different from the listener's environment, while using complete occlusion to eliminate the contribution of this duplicate source to the direct-path sound and to the listener's environment.

TABLE 1

Control parameters for the audio processing system of FIG. 12.

| | type | range | default |
|---|---|---|---|
| ENVIRONMENT parameters | | | |
| EnvironmentID | ULONG | [0, 3] | 0 |
| Room | LONG | [−100, 0] | −10 dB |
| RoomHF | LONG | [−100, 0] | −1 dB |
| Occlusion | LONG | [−100, 0] | 0 dB |
| OcclusionLFRatio | FLOAT | [0.0,1.0] | 0.25 |
| DecayTime | FLOAT | [0.1, 20.0] | 1.49 secs |
| DecayHFRatio | FLOAT | [0.1, 2.0] | 0.83 |
| Reflections | LONG | [−100, 10] | −26 dB |
| ReflectionsDelay | FLOAT | [0.0, 0.3] | 0.007 secs |
| ReflectionsPan | 3DVECTOR | (length 0. to 1.) | (0.0,0.0,0.0) |
| Reverb | LONG | [−100, 20] | 2 dB |
| ReverbDelay | FLOAT | [0.0, 0.1] | 0.011 secs |
| ReverbPan | 3DVECTOR | (length 0. to 1.) | (0.0,0.0,0.0) |
| ENVIRONMENT COUPLING parameters | | | |
| EnvironmentIDFrom | ULONG | [0, 3] | 0 |
| EnvironmentIDTo | ULONG | [0, 3] | 0 |
| Room | LONG | [−100, 0] | −100 dB |
| RoomHF | LONG | [−100, 0] | 0 dB |
| SOURCE parameters | | | |
| EnvironmentID | ULONG | [0, 3] | 0 |
| Room | LONG | [−100, 10] | 0 dB |
| RoomHF | LONG | [−100, 0] | 0 dB |
| Occlusion | LONG | [−100, 0] | 0 dB |
| OcclusionLFRatio | FLOAT | [0.0, 1.0] | 0.25 |
| Exclusion | LONG | [−100, 0] | 0 dB |
| ExclusionLFRatio | FLOAT | [0.0, 1.0] | 1.0 |
| LISTENER parameters | | | |
| EnvironmentID | ULONG | [0, 3] | 0 |

Utilizing the preferred embodiment of the invention, the following advantages may be realized:

Sources heard from adjacent rooms. The reverberation sound emanating from an adjacent room indicates the presence of any source contained in it even though there may be no audible direct path from the source to the listener.

Listener transitions between environments. While walking from room A to room B, the listener can hear the reverberation from room B in front of him/her, becoming wider as he/she walks towards the opening, while the reverberation of room A is left behind. If he/she shouts in room A before running to room B, his/her voice will still be heard reverberating in room A through the door behind him/her.

A source entering or leaving the listener's environment. The transition of a source from room A to room B can be reproduced naturally by fading down the feed from that source into reverberation block A while fading up the feed from that source into reverberation block B.

A listener and a source in two rooms connected through a third room (e.g. a corridor). The source can be heard even if there is no audible direct path to the listener. The source's sound (and the reverberation that it generates in the original room) can feed the reverberation of the intermediate room (the corridor), which in turn is heard through the opening leading to the listener's room.

A listener making a loud sound near the entrance to a reverberant environment (e.g. shouting near the entrance to the bathroom from the living room). The noise feeds the reverberation of the adjacent environment (bathroom) through the opening and this reverberation is heard coming back from the opening.

Having thus described exemplary embodiments of the present invention, it is noted that the disclosures herein are exemplary only and that various other alterations, adaptations and modifications may be made within the spirit and scope of the present invention. Accordingly, the present invention is not limited to the specific embodiments as illustrated herein. For example, the listener's virtual "environment" is not necessarily "inside" or "enclosed" but may be an environment in which there may be very little reverberation or reflection generated by the listener's environ-ment itself, such as an outdoor environment. Reverberation may then be received from an adjacent reverberant "environment," such as a cave or tunnel or entrance to a building.

What is claimed is:

1. A method of processing audio to account for the effect of a plurality of related environments on the sound perceived by a listener simulated to be in one of the environments, comprising:

providing a first reverberation block for a first environment in which the listener is simulated to be located, the first reverberation block having an input and a multi-channel output;

providing 1 to N further reverberation block(s) corresponding to 1 to N further environment(s) related to the first environment, each 1 to N further reverberation block(s) having an input and a multi-channel output;

feeding a signal from a sound source into the first reverberation block and the 1 to N further reverberation block(s);

determining, for each of the first reverberation block and the 1 to N further reverberation block(s), a reverberation coupling signal; and feeding the determined reverberation coupling signals to the inputs of related ones of the first reverberation block and the 1 to N further reverberation block(s).

2. The method of claim 1 wherein the step of feeding the determined reverberation coupling signals includes:

applying, for each related reverberation block to which a particular reverberation coupling signal is provided, a transfer function to the particular reverberation coupling signal to account for the effect on the particular reverberation coupling signal of intervening structures.

3. The method of claim 1 wherein each of the first and the 1 to N further reverberation block(s) comprises functionality for modifying its multi-channel output signal to provide perceived emphasis in a desired direction.

4. The method of claim 2 wherein the transfer function is provided by applying an adjustable gain and an adjustable low pass filter to the particular reverberation coupling signal.

5. The method of claim 1 wherein the step of feeding a signal from a sound source into the first reverberation block and the 1 to N further reverberation block(s) includes applying a transfer function to the signal from the sound source for each of the first reverberation block and the 1 to N further reverberation blocks.

6. The method of claim 3 wherein the step of feeding a signal from a sound source into the first reverberation block and the 1 to N further reverberation block(s) includes applying a transfer function to the signal from the sound source for each of the first reverberation block and the 1 to N further reverberation blocks.

7. The method of claim 6 wherein the transfer function that is applied to the signal from the sound source for each of the reverberation blocks is provided by applying an adjustable gain and an adjustable low pass filter to the signal from the sound source.

8. An audio processing system that accounts for the effect of a plurality of related environments on the sound perceived by a listener simulated to be in one of the environments, comprising:

a first reverberation block for a first environment in which the listener is simulated to be located, the first reverberation block having an input and a multi-channel output;

1 to N further reverberation block(s) corresponding to 1 to N further environment(s) related to the first environment, each 1 to N further reverberation block(s) having an input and a multi-channel output; and a sound source processing block to provide a signal to the first reverberation block and the 1 to N further reverberation block(s), wherein the first reverberation block and each 1 to N further reverberation block(s) are each operative to determine a reverberation coupling signal, the first reverberation block and each 1 to N further reverberation block(s) are each coupled to feed determined reverberation coupling signals to related ones of the first and the 1 to N further reverberation block(s).

9. The system of claim 8 further comprising, for each related reverberation block to which a particular reverberation coupling signal is provided, a transfer function that is applied to the particular reverberation coupling signal to account for the effect on the particular reverberation coupling signal of intervening structures.

10. The system of claim 8 wherein each of the first and the 1 to N further reverberation block(s) includes functionality for modifying its multi-channel output signal to provide perceived emphasis in a desired direction.

11. The system of claim 9 wherein the transfer function comprises an adjustable gain and an adjustable low pass filter that is applied to the particular reverberation coupling signal.

12. The system of claim 8 wherein the sound source processing block includes transfer functions that are applied to the signal from the sound source for each of the first reverberation block and the 1 to N further reverberation blocks.

13. The system of claim 10 wherein the sound source processing block includes transfer functions that are applied to the signal from the sound source for each of the first reverberation block and the 1 to N further reverberation blocks.

14. The system of claim 13 wherein the sound source processing block transfer functions each comprise an adjustable gain and an adjustable low pass filter.

15. A method of processing audio to account for the effect of a plurality of related environments on the sound perceived by a listener simulated to be in one of the environments, comprising:

providing a first reverberation block for a first environment in which the listener is simulated to be located, the first reverberation block having an input and a multi-channel output;

providing 1 to N further reverberation block(s) corresponding to 1 to N further environment(s) related to the first environment, each 1 to N further reverberation block(s) having an input and a multi-channel output;

feeding a signal from a sound source into the first reverberation block and the 1 to N further reverberation block(s);

determining, for each of the 1 to N further reverberation block(s), a reverberation output signal; and determining a directional emphasis for each reverberation output signal; and providing each reverberation output signal to a multi-channel output, each reverberation output signal being modified in accordance with its determined directional emphasis.

16. The method of claim 15 wherein the step of feeding a signal from a sound source into the first reverberation block and the 1 to N further reverberation block(s) includes applying a transfer function to the signal from the sound source for each of the first reverberation block and the 1 to N further reverberation blocks.

17. The method of claim 16 wherein the transfer function that is applied to the signal from the sound source for each of the reverberation blocks is provided by applying an adjustable gain and an adjustable low pass filter to the signal from the sound source.

18. An audio processing system that accounts for the effect of a plurality of related environments on the sound perceived by a listener simulated to be in one of the environments, comprising:

a first reverberation block for a first environment in which the listener is simulated to be located, the first reverberation block having an input and a multi-channel output;

1 to N further reverberation block(s) corresponding to 1 to N further environment(s) related to the first environment, each 1 to N further reverberation block(s) having an input and a multi-channel output; and a sound source processing block to provide a signal to the first reverberation block and the 1 to N further reverberation block(s), wherein each 1 to N further reverberation block(s) is operative to determine a reverberation output signal, each 1 to N further reverberation block(s) is operative to determine a directional emphasis for each reverberation output signal; and each 1 to N further reverberation block(s) is operative to provide its reverberation output signal to a multi-channel output, each reverberation output signal being modified in accordance with its determined directional emphasis.

19. The system of claim 18 wherein the sound source processing block includes transfer functions that are applied to the signal from the sound source for each of the first reverberation block and the 1 to N further reverberation blocks.

20. The system of claim 19 wherein the sound source processing block transfer functions each comprise an adjustable gain and an adjustable low pass filter.

* * * * *